US006633593B2

(12) United States Patent
Ksendzov et al.

(10) Patent No.: US 6,633,593 B2
(45) Date of Patent: Oct. 14, 2003

(54) TUNABLE SEMICONDUCTOR LASER HAVING CAVITY WITH WAVELENGTH SELECTIVE MIRROR AND MACH-ZEHNDER INTERFEROMETER

(75) Inventors: Alexander Ksendzov, La Crescenta, CA (US); Randy Dean May, Montrose, CA (US)

(73) Assignee: SpectraSensors, Inc., Altadena, CA (US)

( * ) Notice: Subject to any disclaimer, the term of this patent is extended or adjusted under 35 U.S.C. 154(b) by 12 days.

(21) Appl. No.: 10/035,986

(22) Filed: Dec. 28, 2001

(65) Prior Publication Data

US 2002/0085595 A1 Jul. 4, 2002

Related U.S. Application Data

(63) Continuation-in-part of application No. 09/753,285, filed on Jan. 2, 2001.

(51) Int. Cl.[7] .................................. H01S 3/10
(52) U.S. Cl. ........................ 372/20; 372/32; 372/98; 372/92; 372/94
(58) Field of Search ........................... 372/20, 32, 92, 372/98, 94, 93

(56) References Cited

U.S. PATENT DOCUMENTS 4,468,773 A    8/1984   Seaton (List continued on next page.)

OTHER PUBLICATIONS

Tatsuno et al, 50 Ghz Spacing, Multi–Wavelength Tunable Locker . . . , Unknown.
Kazarinov et al, Narrow–Based Resonant Optical. Reflectors and Resonant Optical Transformers.
For Laser Stabilization and Wavelength Division Multiplexing, IEEE Journal of Quantum Electronics vol. OE–23, No. 9, Sep. 1987.

Primary Examiner—Leon Scott, Jr.
(74) Attorney, Agent, or Firm—Carl A. Kukkonen, III

(57) ABSTRACT

The semiconductor laser has a resonance cavity composed of a gain chip, a Mach-Zehnder wide tuning port, and a wavelength-selective mirror component formed either as a ring resonator or a reflective Fabry-Perot etalon. Optical signals generated by the gain chip propagate through the wide tuning port and into the wavelength-selective mirror component and are then reflected back to the gain chip. The wavelength-selective mirror component is configured to reflect only those optical signals having wavelengths within a set of sharp peaks so that the laser cavity resonates only within the sharp peaks. The wavelength-selective mirror component is heated to adjust internal dimensions to maintain one of the sharp peaks at a selected emission wavelength. As optical signals pass through the wide tuning port, the signals are split between two channels of differing lengths resulting in optical interference. The optical interference limits the ability of the laser cavity to resonate at wavelengths other than near the center of a single broad peak determined by the relative lengths of the two channels. The wide tuning port is heated to vary the relative lengths of the two channels to maintain the single broad peak at the selected transmission wavelength. In this manner, the laser cavity is controlled to resonate substantially only at the single selected wavelength. Resonance at any of the other wavelengths reflected by the wavelength-selective mirror component is greatly limited, thereby significantly reducing transmission sidebands generated by the laser. Specific implementations of the ring resonator mirror and the reflective etalon are described.

35 Claims, 9 Drawing Sheets

U.S. PATENT DOCUMENTS

| | | |
|---|---|---|
| 4,689,794 A | 8/1987 | Brosnan |
| 4,955,027 A | 9/1990 | Piper |
| 4,982,406 A | 1/1991 | Facklam |
| 5,105,433 A * | 4/1992 | Eisele et al. ............... 372/50 |
| 5,253,309 A * | 10/1993 | Nazarathy et al. ............ 385/4 |
| 5,257,276 A | 10/1993 | Forouhar |
| 5,267,256 A | 11/1993 | Saruwatari |
| 5,333,219 A * | 7/1994 | Kuznetsov .................. 385/45 |
| 5,444,724 A * | 8/1995 | Goto ........................ 372/20 |
| 5,509,022 A | 4/1996 | Lowery |
| 5,546,414 A | 8/1996 | Pfeiffer |
| 5,627,648 A | 5/1997 | Garrett |
| 5,633,883 A | 5/1997 | Shi |
| 5,706,301 A | 1/1998 | Lagerstrom |
| 5,798,859 A | 8/1998 | Colbourne |
| 5,875,272 A * | 2/1999 | Kewitsch et al. ............ 385/37 |
| 5,956,355 A * | 9/1999 | Swanson et al. ............. 372/20 |
| 6,078,418 A | 6/2000 | Hansen |
| 6,088,142 A | 7/2000 | Cao |
| 6,101,200 A | 8/2000 | Burbidge |
| 6,122,031 A | 9/2000 | Tei |
| 6,125,128 A | 9/2000 | Mizrahi |
| 6,134,253 A | 10/2000 | Munks |
| 6,151,340 A | 11/2000 | Rivers |
| 6,160,826 A * | 12/2000 | Swanson et al. ............. 372/20 |
| 6,181,717 B1 | 1/2001 | Kner |
| 6,222,861 B1 | 4/2001 | Kuo |
| 6,240,109 B1 | 5/2001 | Shieh |
| 6,396,605 B1 * | 5/2002 | Heflinger et al. ........... 398/140 |
| 2001/0048783 A1 * | 12/2001 | Herble et al. .............. 385/16 |
| 2001/0050794 A1 * | 12/2001 | Brindel et al. ............. 359/176 |
| 2002/0085595 A1 * | 7/2002 | Ksendzov et al. ............ 372/20 |
| 2002/0085609 A1 * | 7/2002 | Ksendzov et al. ............ 372/94 |

* cited by examiner

TUNABLE SEMICONDUCTOR LASER HAVING CAVITY WITH WAVELENGTH SELECTIVE MIRROR AND MACH-ZEHNDER INTERFEROMETER

RELATED APPLICATIONS

This patent application is a Continuation-in-Part of U.S. patent application Ser. No. 09/753,285, of Alexander Ksendzov and Randy D. May entitled "Tunable Semiconductor Laser Having Cavity With Ring Resonator Mirror And Mach-Zehnder Interferometer", filed Jan. 2, 2001.

BACKGROUND OF THE INVENTION

1. Field of the Invention

The invention generally relates to tunable lasers and in particular to tunable lasers for use in a dense wavelength division multiplexers (DWDM).

2. Description of the Related Art

A DWDM is a device for simultaneously transmitting a set of discrete information channels over a single fiber optic transmission line. A conventional fiber optic transmission line is capable of reliably transmitting signals within a bandwidth of 1280 to 1625 nanometers (nm), the "low loss" region for silica fiber. Within that overall bandwidth, the International Telecommunications Union (ITU) has defined various transmission bands and specified certain transmission channel protocols for use within each transmission band. One example of a transmission band is the ITU "C" band, which extends 40 nm from 1565 nm to 1565 nm. Within the C band, specific transmission channel protocols of 40, 80, or 160 discrete channels are defined and, for each protocol, the ITU has defined a grid of transmission wavelengths, with each line corresponding to an acceptable transmission wavelength. For the 40 channel protocol, the corresponding ITU grid has 40 lines with channel spacing of 0.8 nm; for the 80 channel protocol, the corresponding ITU grid has 80 lines with channel spacing of 0.4 nm; and so forth. The protocols have been defined to ensure that all DWDM transmission and reception equipment is fabricated to operate at the same wavelengths. Other exemplary ITU transmission bands are the S- and L-bands.

To simultaneously transmit the set of channels on a fiber optic cable, the DWDM employs a set of the individual lasers, with one laser per channel. FIG. 1 illustrates a DWDM 100 having forty individual lasers 102 for transmitting optical signals via a single optic fiber 104. An optical multiplexer 106 couples signals received from the individual lasers via a set of intermediate optic fibers 107 into output optic fiber 104. Each laser transmits at a different wavelength of the forty channel ITU C band. This enables forty separate channels of information to be transmitted via the single optical fiber 104 to a de-multiplexer (not shown) provided at the far end of the optical fiber.

To permit the DWDM to transmit forty separate channels simultaneously, each individual laser must be tuned to a single ITU transmission channel wavelength. Preferably, widely tunable lasers (WTLs) are employed as the transmission lasers to permit any of the individual lasers to be tuned to any of the ITU channels. The wide tunability is achieved by choosing the amplifying medium with a wide gain curve (typically a semiconductor structure) and configuring the WTL in such a way that low cavity loss is only achieved at a narrow wavelength region. The WTL is tuned by changing the aforementioned peak in the spectral response of the cavity to operate at a particular resonant wavelength aligned with a selected one of the ITU channel wavelengths. The desire to achieve low bit error rate leads to requirements for high spectral purity of the emitted light which is usually stated in terms of the side mode suppression, i.e. the ratio of the light intensity emitted by the WTL at the side band wavelength to the intensity of the main mode. While the requirements may differ from system to system, typically for reliable operation of a DWDM transmitting ITU channels, the side mode suppression should be 30 decibels (dB) or better. Such requirements often are not easily reconciled with the wide tunability, particularly with relatively inexpensive WTLs. Furthermore, while monolithic semiconductor WTLs, currently the state of the art devices, provide the necessary degree of miniaturization and ruggedness, tuning of such devices involves a complicated tuning pattern. That is, tuning currents are applied to multiple sections of the laser and their influence on the emitted wavelength and spectral purity is not independent.

Accordingly, it would be desirable to provide an improved WTL capable of being more easily, precisely and reliably tuned to a selected wavelength and in particular to provide an improved WTL capable of meeting the aforementioned 30 dB sideband requirement for use within DWDMs transmitting at ITU channel wavelengths. It is to these ends that the invention is primarily directed.

SUMMARY OF THE INVENTION

In accordance with the invention, a semiconductor laser is provided having a cavity comprising a gain chip, an interferometric wide tuning port, and a reflective etalon. The gain chip provides radiant energy and amplification for resonance within the cavity. The reflective etalon, which may be reflective Fabry-Perot etalon, limits resonance within the cavity to a set of sharp resonance peaks. The interferometric wide tuning port, which may be a Mach-Zehnder interferometer, selects one resonance peak out of the aforementioned set of peaks based on a wide tuning profile having a broad peak. The wide tuning port is configured to align a wavelength of the broad peak of the wide tuning profile at a selected wavelength. The reflective etalon is configured to align a wavelength of one of the sharp peaks also at the selected wavelength. In this manner, the laser cavity resonates primarily at only the selected emission wavelength. Other sharp resonant peaks permitted by the reflective etalon are filtered by the wide tuning port to substantially limit the amplitudes thereof. Hence, transmission sidebands of the laser are substantially reduced. With appropriate selection of components, the side bands may be limited to amplitudes 30 dB below the selected transmission wavelength.

In an exemplary embodiment, the semiconductor laser is used as a WTL within a DWDM transmitting at ITU channel wavelengths. A Mach-Zehnder wide tuning port and a reflective Fabry-Perot etalon are formed together on a single silicon tuning chip coupled to a separate gain chip with an output optical channel of the gain chip coupled to an input optical channel of the wide tuning port. The wide tuning port includes a splitter for splitting the input channel into a pair of channels of differing lengths and a combining section for combining the pair of optical channels into a single output channel. The single output channel of the wide tuning port is coupled to a main trunk channel of the reflective etalon. A Fabry-Perot waveguide side channel having reflecting surfaces at opposing ends is formed adjacent the main trunk. A central portion of the Fabry-Perot side channel is sufficiently close to the main trunk to permit evanescent coupling of radiant energy propagating therein. Hence, radiant energy entering the reflective etalon from the wide tuning port is coupled into the Fabry-Perot side channel, where it is reflected back and forth between the reflecting surfaces. In turn, the radiant energy reflecting within the Fabry-Perot side channel is coupled back into the main trunk channel also via evanescent coupling. At resonance wavelengths of the Fabry-Perot side channel, substantially all of the radiant energy coupled back into the main trunk propagates toward the wide tuning port. At other wavelengths, the fraction of the energy returning to the gain chip is greatly diminished.

Thus, with this configuration, optical signals generated by the gain chip propagate through the wide tuning port and into the reflective etalon. Optical signals at the resonance wavelengths of the Fabry-Perot waveguide side channel are then reflected back through the wide tuning port to the gain chip then are reflected again by the gain chip. Optical signals not at the resonance wavelengths of the Fabry-Perot side channel do not couple effectively into the reflective etalon. In this manner, resonance within the laser cavity is permitted only at the various resonance wavelengths of the side channel, resulting in the aforementioned sharp resonance peaks. The resonance wavelengths of the side channel depend primarily upon the length of the side channel. The reflective etalon is heated, or otherwise controlled, to vary the length of the side channel so as to align and maintain one of the sharp resonance peaks at a selected transmission wavelength, such as at a particular ITU channel wavelength.

Hence, optical signals at the resonance wavelengths of the Fabry-Perot waveguide side channel reflect back and forth between the gain chip and the reflective etalon through the Mach-Zehnder wide tuning port. As the optical signals propagate through the wide tuning port, the signals are split between two channels of differing lengths resulting in optical interference. The optical interference limits the ability of the laser cavity to resonate at wavelengths wherein destructive interference occurs. As a result, resonance within the overall laser cavity is substantially limited to within a broad peak determined by the relative lengths of the two channels. The wide tuning port is heated, or otherwise controlled, to vary the relative lengths or refractive indexes of the two channels so as to align and maintain the broad peak at the selected transmission wavelength. In this manner, only one of the sharp resonant peaks permitted by the reflective etalon is also aligned with the broad peak permitted by the wide tuning port. Other sharp resonant peaks permitted by the reflective etalon, representing sidebands, are substantially reduced by the interference provided by the wide tuning port or are at wavelengths otherwise not generated by the gain chip. Hence, the laser cavity resonates substantially only at a single wavelength, namely the selected transmission wavelength. The amplitudes of sidebands are thereby greatly limited. Resonance within the laser cavity generates coherent light which is output through an opposing end of the gain chip for use as a transmission signal. The signal may be modulated to encode digital information. By limiting the amplitudes of the sidebands to, for example, 30 dB below the amplitude of the selected transmission wavelength, a data transmission error rate can be reduced to as low as $10^{-9}$ or below.

Thus, the invention provides an improved WTL capable of being easily, precisely and reliably tuned to a selected wavelength while also being capable of meeting the aforementioned 30 dB sideband requirement for use within DWDMs transmitting at ITU channel wavelengths. Other embodiments, features and advantages of the invention will be discussed below.

BRIEF DESCRIPTION OF THE DRAWINGS

The features, objects, and advantages of the invention will become more apparent from the detailed description set forth below when taken in conjunction with the drawings in which like reference characters identify correspondingly throughout and wherein.

DETAILED DESCRIPTION OF THE EXEMPLARY EMBODIMENTS

With reference to the remaining figures, exemplary embodiments of the invention will now be described.

DWDM with Mach-Zehnder/Ring-Resonator WTLs

Figure 2:
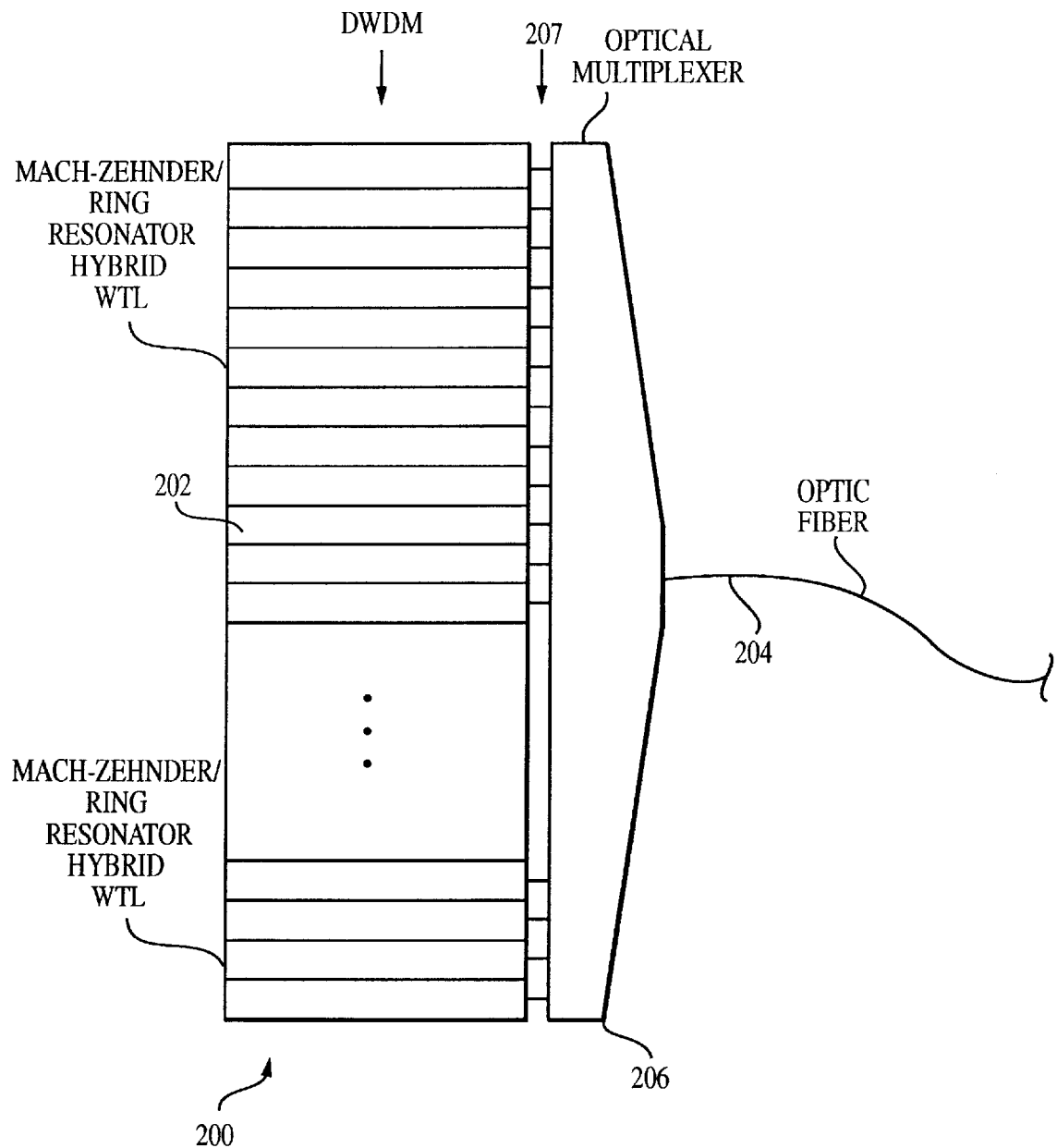
FIG. 2 illustrates a DWDM having hybrid WTLs configured in accordance with a first exemplary embodiment of the invention wherein each hybrid WTL has a laser cavity incorporating a Mach-Zehnder interferometer and a ring resonator mirror.

FIGS. 2–8 illustrate an exemplary embodiment of a DWDM having a hybrid WTL formed using a Mach-Zehnder interferometer as a wide tuning port and a ring resonator as a wavelength-selective mirror. Referring first to FIG. 2, a DWDM 200 is illustrated with forty individual hybrid WTLs 202 for transmitting optical signals on forty ITU C-band channels via a single optic fiber 204. An optical multiplexer 206 couples signals received from the individual hybrid WTLs via a set of intermediate optic fibers 207 into output optic fiber 204 to a demultiplexer (not shown) provided at the far end of the optical fiber. Each hybrid WTL is tuned to transmit optical signals at a wavelength selected from the forty channel ITU C band for use in optically transmitting signals along output optic fiber 204. The signals may be, for example television signals, telephone signals, computer network signals etc. Typically, each WTL is tuned to transmit at a different one of the wavelengths so that the DWDM can transmit signals at any of the forty wavelengths of the C band, thereby taking full advantage of the bandwidth available within the C band. In any case, each of the hybrid WTLs is configured so as to automatically maintain the wavelength of transmitted signals at a selected C band channel wavelength despite power fluctuations, changes in temperature, or other factors. Moreover, each of the hybrid WTLs is configured so as to ensure that transmission sidebands of the WTL are less than some predetermined acceptable level, typically 30 dB, thereby ensuring an acceptable signal transmission error rate of, for example, $10^{-9}$. The features of the hybrid WTL will now be described in detail with reference to the remaining figures, wherein an overview of the configuration and operation of the hybrid WTL is provided with reference to FIGS. 3–6 and wherein a specific structural implementation of a tuning chip of the hybrid WTL is described with reference to FIGS. 7 and 8.

Figure 3:
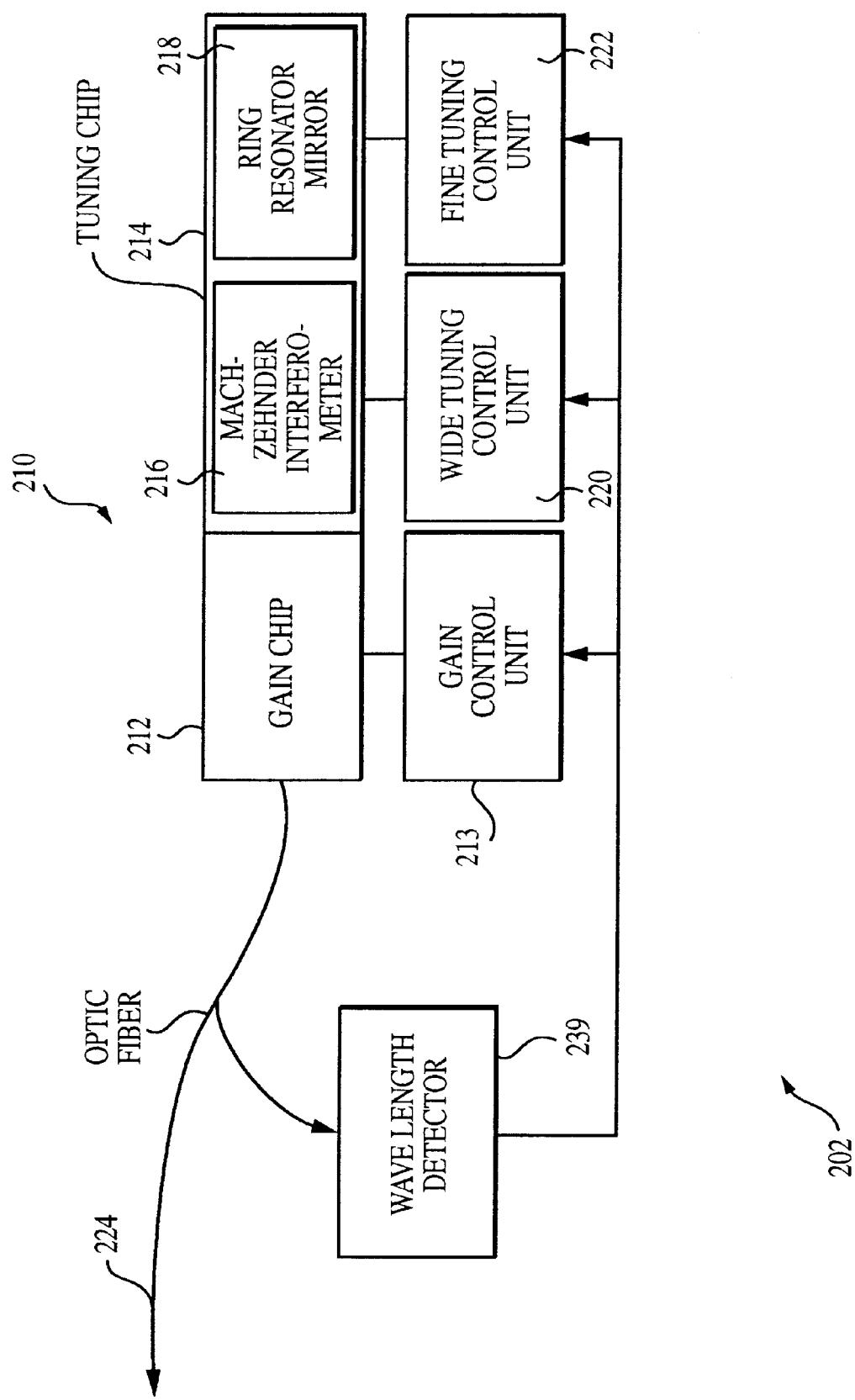
FIG. 3 is a block diagram illustrating an exemplary hybrid WTL for use in FIG. 2.

FIG. 3 illustrates a first exemplary embodiment of the hybrid WTLs 202. WTL 202 includes a laser cavity 210 formed from a gain chip 212 and a tuning chip 214. The gain chip is a III/IV material semiconductor chip. The tuning chip is a silicon semiconductor chip. The gain chip operates under the control of a gain control unit 213 which controls the gain chip to generate light or other radiant energy for coupling into the tuning chip. In the specific example described herein, the gain chip is controlled to generated light having a wavelength somewhere within a tuning range of about 10 nm near a selected channel of the ITU C band, which ranges from 1525 nm to 1565 nm. In the absence of the tuning chip, the wavelength may vary throughout the tuning range depending on the current applied to the gain chip by the gain control unit. Tuning chip 214 includes a Mach-Zehnder interferometer portion 216 and a ring resonator mirror portion 218. The Mach-Zehnder interferometer operates as a wide tuning port under control of a wide tuning control unit 220 to limit resonance within the laser cavity to within a wide tuning profile having a single broad peak within the gain curve of the gain chip. The ring resonator mirror 218 operates as a fine tuning device under control of a fine tuning unit 222 to limit resonance within the laser cavity to within a set of sharp resonant peaks within the tuning range of the gain chip.

Figure 4:
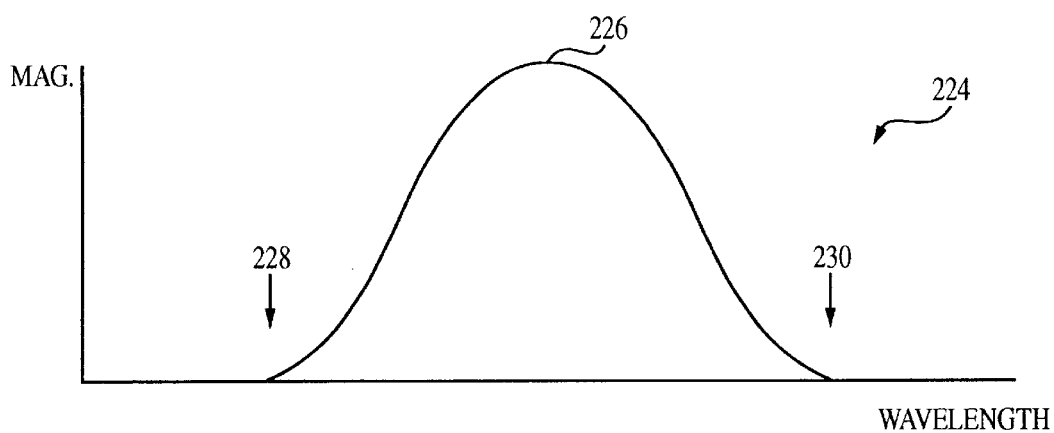
FIG. 4 is a graph illustrating a wide tuning profile achieved by the Mach-Zehnder interferometer of the WTL of FIG. 3.
Figure 5:
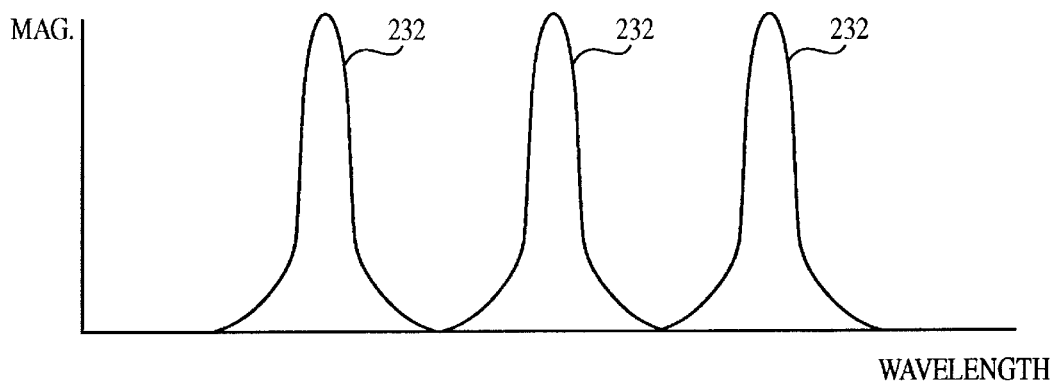
FIG. 5 is a graph illustrating a set of narrow resonant wavelength bands achieved by the ring resonator mirror of the WTL of FIG. 3.

The wide tuning profile generated by the Mach-Zehnder interferometer is shown in FIG. 4 and is substantially sinusoidal. Only that portion of the sinusoidal profile lying within the tuning range of the gain chip is shown. As can be seen, wide tuning profile 224 has a broad center peak 226 (achieved through constructive interference within the Mach-Zehnder interferometer) and a pair of opposing reduced signal portions 228 and 230 (caused be destructive interference within the interferometer). The wavelength of the center peak depends upon internal dimensions of the interferometer to be described in greater detail below. The set of sharp resonant peaks permitted by the ring resonator is shown in FIG. 5. The set of sharp peaks 232 arises as a result of selective reflection characteristics of the ring resonator. The wavelengths of the sharp peaks and their relative spacing depend upon internal dimensions of the ring resonator also to be described in greater detail below.

Figure 6:
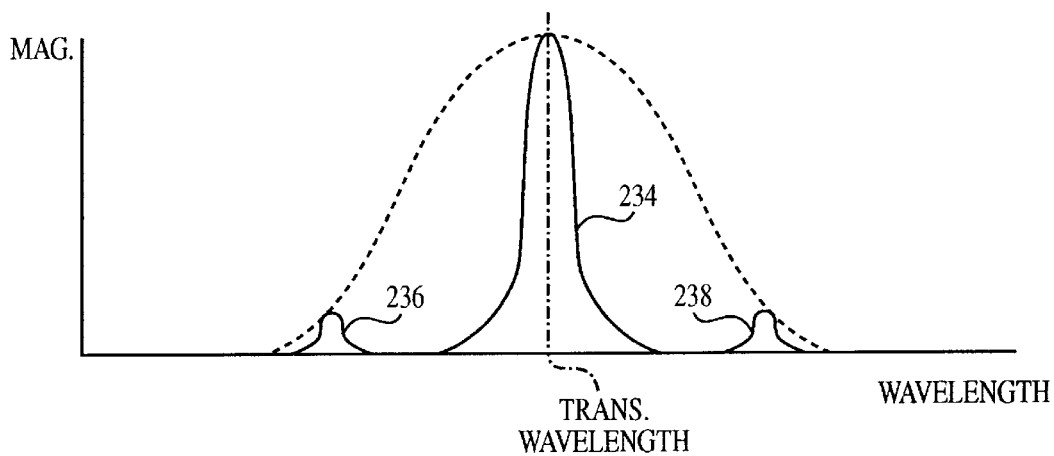
FIG. 6 is a graph illustrating a resulting output wavelength spectrum achieved using the combination of the Mach-Zehnder interferometer and the ring resonator mirror of the WTL of FIG. 3.

Referring again to FIG. 3, wide tuning control unit 220 controls the Mach-Zehnder interferometer to center the wide tuning profile at a selected ITU C band channel wavelength within the tuning range of the gain chip. Fine tuning control unit 222 controls the ring resonator mirror to center one of the sharp resonant peaks at the same ITU C band channel wavelength. The sharp peak corresponding to the selected C band channel wavelength resonates freely within the laser cavity whereas the sideband peaks permitted by the ring resonator mirror (i.e. transmission side bands) are substantially filtered by the Mach-Zehnder interferometer to greatly limit resonance thereof in the laser cavity. The resulting laser emission spectrum is shown in FIG. 6 wherein a single sharp peak 234 appears at the selected wavelength and adjacent sharp peaks 236 and 238 appear as diminished side bands. Preferably, the Mach-Zehnder interferometer and the other laser cavity components are configured so that when properly tuned, sideband peaks 236 and 238 are held at least 30 dB below the level of sharp peak 234. The actual level of the sidebands emitted by WTL depends not only on the shape of the wide tuning profile but on the combined characteristics of the gain chip and tuning cavity. Hence, the wide tuning profile need not necessarily account for the full 30 dB difference and exact alignment of the sidebands with reduced portions 228 and 230 is not necessarily optimal in all cases. As an example, for a typical InGaAsP gain chip, the Mach-Zehnder interferometer need only cause a 2% reduction of the unwanted ring resonances to achieve the desired 30 dB side mode suppression. For any particular application, routine experimentation is performed to determine optimal fabrication and operational characteristics for the WTL.

Figure 1:
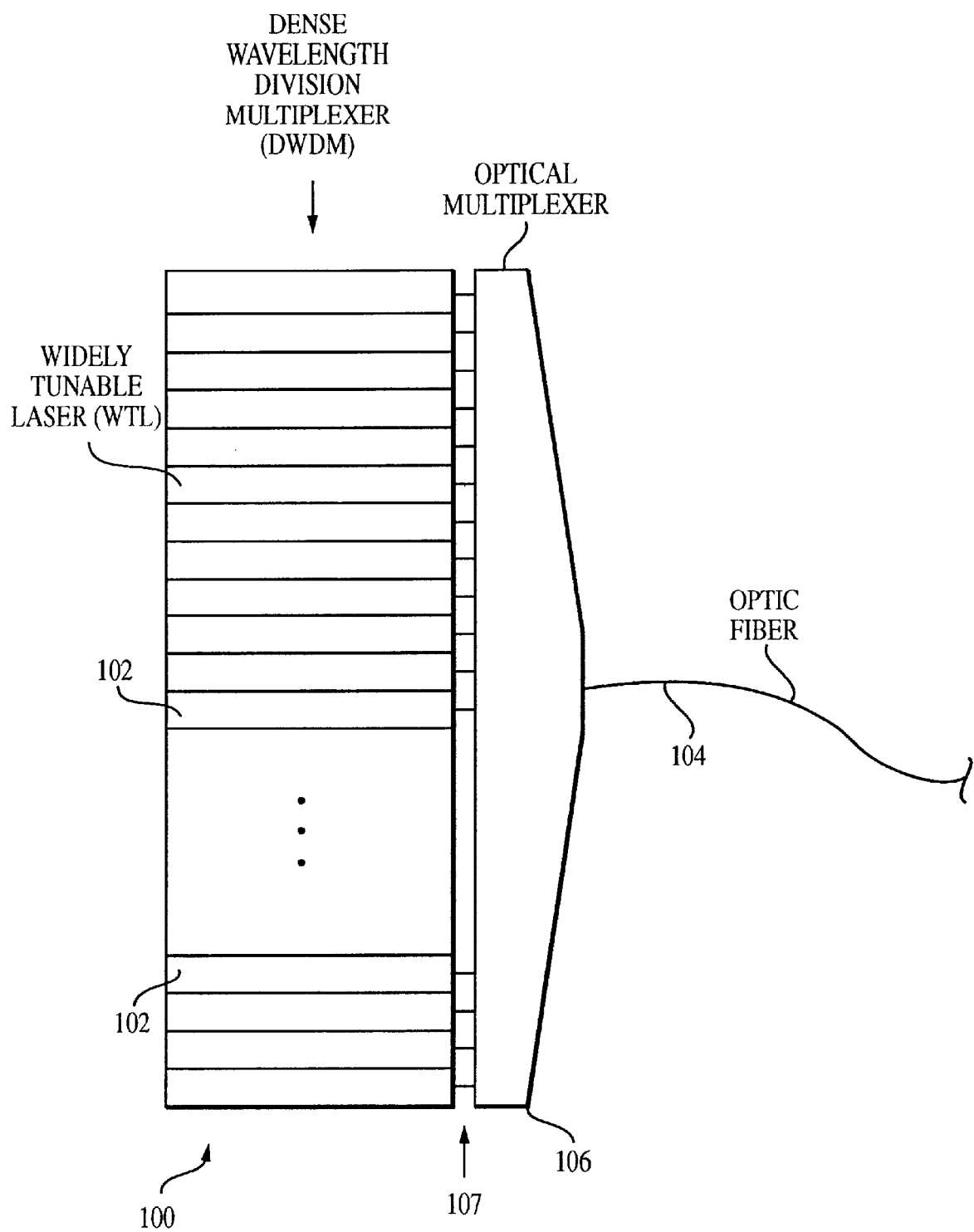
FIG. 1 illustrates a DWDM configured in accordance with the prior art.

Referring once more to FIG. 3, after the laser is permitted to resonate sufficiently to generate a coherent optical beam at the selected wavelength, the coherent beam is output from the gain chip of the WTL through optic fiber 224 for use by the DWDM. The coherent optical signal may be modulated, by devices not shown, to encode information therein for output via intermediate optic fiber 207 (FIG. 1) and ultimately for transmission via optic fiber 204 (also FIG. 1) along with other coherent optical communication signals at other ITU C band channels. By configuring and tuning the WTL so that the sidebands are at least 30 dB below the level of signals at the selected channel wavelength, error rates in the transmission of information encoded within the coherent optical communication signal are kept below $10^{-9}$.

To ensure that the optical signal remains fixed precisely at the selected C band channel wavelength and that the sidebands remain at levels 30 dB lower, a feedback system is provided for providing feedback to wide tuning control unit 220 and fine tuning control unit 222. The feedback system includes a splitter connected to optical fiber 224 for splitting off a portion of the optical signal output from laser cavity 210 to a wavelength detector 239, which provides a feedback signal to wide tuning control unit 220 and fine tuning control unit 222. The feedback signal indicates the actual wavelength of the output signal. If the actual wavelength begins to deviate from the selected C band channel wavelength, fine tuning control unit 222 automatically adjusts the ring resonator portion of tuning chip 214 so as to maintain the wavelength of sharp resonant peak 234 (FIG. 6) at the selected C band channel wavelength. Wide tuning control unit 220 also automatically adjusts the Mach-Zehnder interferometer portion of the tuning chip so as to maintain center wavelength 226 (FIG. 4) of the broad tuning profile peak at the selected wavelength. Additionally, feedback may be provided to the gain chip control unit.

Thus, a feedback system is described for providing feedback to the wide tuning control unit and the fine tuning control unit. Depending upon how quickly and significantly the output transmission wavelength varies, feedback may be provided substantially in real-time or may be provided only once per day or per week. In other implementations, no feedback at all is provided. Rather, the levels of the control signals applied to the gain chip, Mach-Zehnder interferometer and ring resonator are set once so as to achieve a selected absolute output wavelength and are not adjusted again unless the output wavelength is to be changed from one ITU channel to another. Techniques for quickly and efficiently determining the appropriate levels for laser control signals so as to achieve particular output wavelengths is described in co-pending U.S. patent application "Method And Apparatus For Determining Transmission Wavelengths For Lasers In A Dense Wavelength Division Multiplexer" of Randy May, Ser. No. 09/685,212 filed Oct. 10, 2000, which is assigned to the assignee of the present patent application and incorporated by reference herein.

Figure 7:
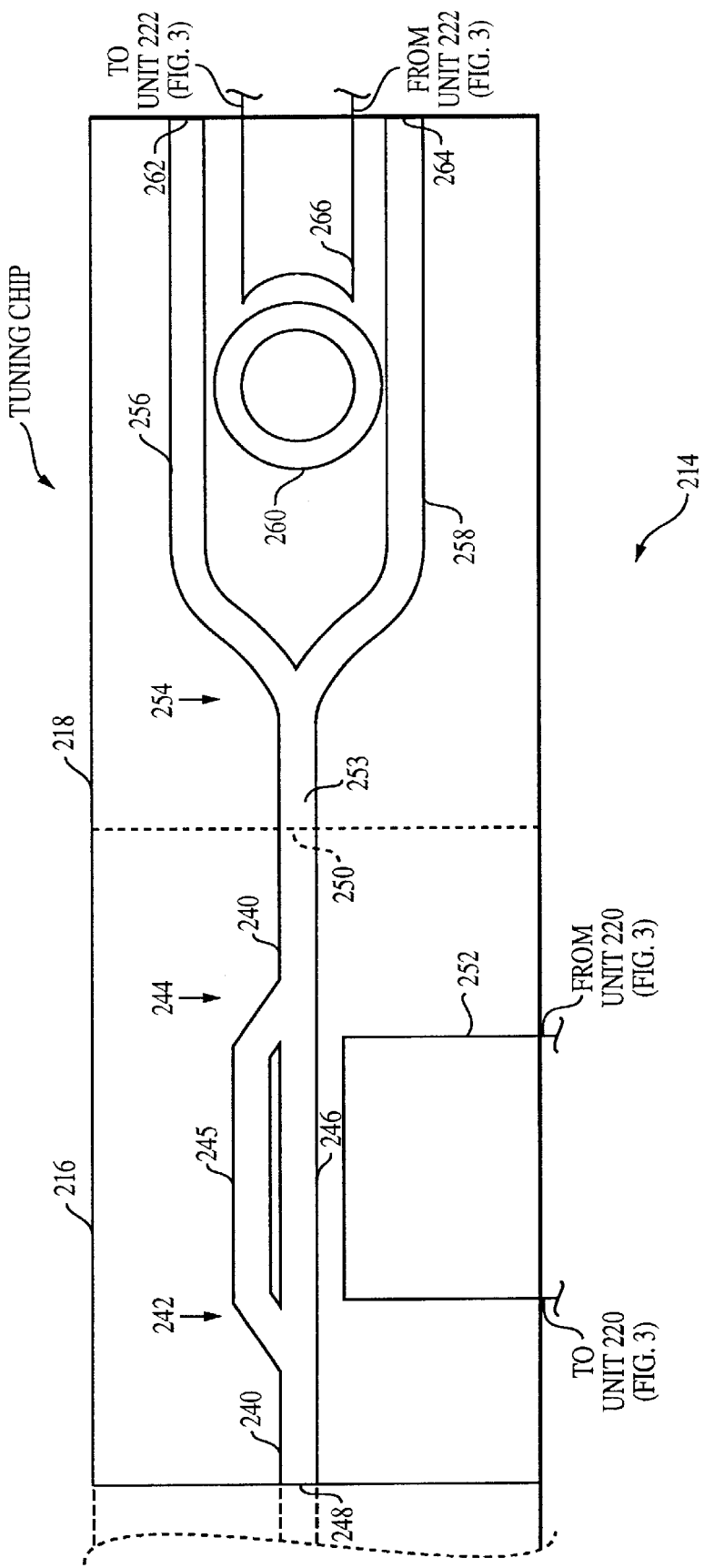
FIG. 7 is a top view of a tuning chip of the hybrid WTL of FIG. 3 illustrating optical channels of the tuning chip, and particularly illustrating the channels of the ring resonator.
Figure 8:
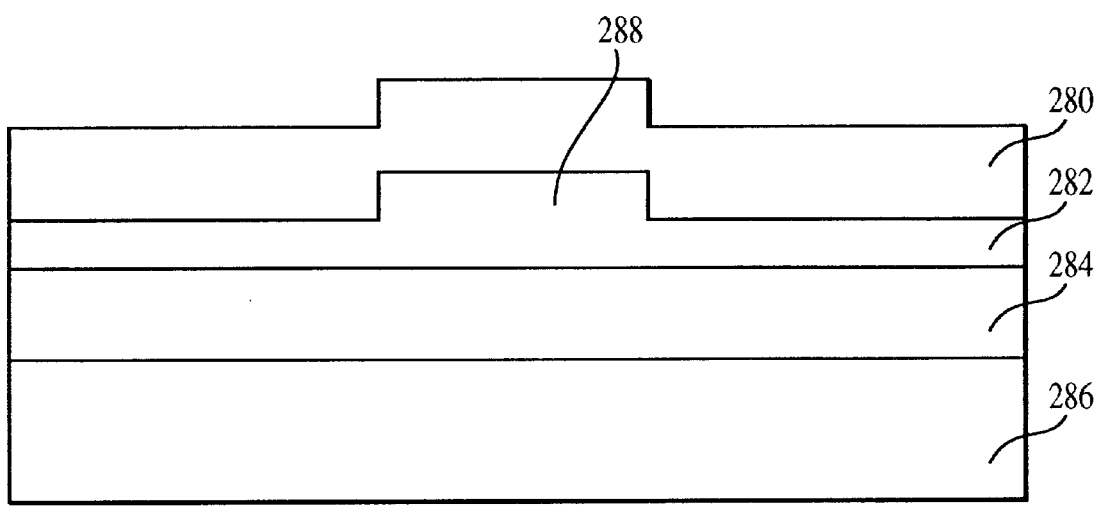
FIG. 8 is a cross-sectional view of a wave guide structure appropriate for use as the tuning chip of FIG. 7.

Referring now to FIG. 7, an exemplary implementation of the tuning chip of the hybrid laser will now be described. Tuning chip 214 is a generally planar optical light circuit chip having channels (rib-loaded wave guides) therein configured to permit propagation of optical signals. FIG. 7 shows the configuration of the channels within the tuning chip. A cross section of a portion of a wave guide structure having a single channel is depicted in FIG. 8. The wave guide (channel) is formed from a stack of dielectrics such as a silicon dioxide layer 280 followed by a silicon oxynitride layer 282 followed by another silicon dioxide layer 284 deposited on a silicon substrate 286. The silicon oxynitride layer, which is the core of the chip, possesses light guiding properties because its index of refraction is greater than that of the adjacent silicon dioxide layers. Lateral guiding is accomplished by creating a rib 288 in the top portion of the core. In one example, silicon dioxide layer 280 is 1 $\mu$m in width, silicon oxynitride layer 282 is 0.5 $\mu$m in width, silicon dioxide layer 284 is 5 $\mu$m in width and silicon substrate 286 is 0.3 millimeters in width. Rib or ridge 288 extends 600 Angstroms above other portions of layer 282. The representations of the channels in FIGS. 7 and 8 are not necessarily to scale.

Referring again to the entire tuning chip of FIG. 7, the Mach-Zehnder interferometer portion 216 of the tuning chip includes a main channel 240 and a pair of splitters 242 and 244 splitting the main channel into separate inner channels 245 and 246 of differing length. Main channel 240 is coupled at a first end 248 to an optical channel of the gain chip (shown in phantom lines) and is coupled at a second end 250 to an input optical channel of ring resonator mirror portion 218. With this configuration, coherent light propagating through the Mach-Zehnder interferometer (regardless of propagation direction) is split onto inner channels 245 and 246 then recombined. The recombined signals may be out of phase with respect to one another depending upon the wavelength of light and by the difference in length between channels 245 and 246. If completely out of phase, the light from channel 245 destructively interferes with the light from channel 246 to substantially eliminate that wavelength of light. If completely in phase, the light from channel 245 constructively interferes with the light from channel 246 to substantially increase the magnitude of that wavelength of light. Thus, the wide tuning interference profile as illustrated in FIG. 4 is produced and resonance within the laser cavity is limited by the wide tuning interference profile.

The tuning chip is fabricated to have a nominal channel length difference of about 20 $\mu$m so as to provide optical interference resulting in a wide tuning profile having a center wavelength 226 (FIG. 4) of 1550 nm and a width (defined as the wavelength difference between portions 228 to 230 of FIG. 4) of about 41 nm. A heating element 252 is provided in the tuning chip to heat the chip so as to vary the channel length and refractive index difference to adjust the center wavelength within the range of 1525 nms to 1565 nms to thereby permit the wide tuning profile to be centered on any of the ITU C band channel wavelengths. The heating element may be, for example, a resistive element formed on top of the wave guide structure directly above channels 245 and 246. The application of heat to channels 245 and 246 will vary the relative channel length difference and mode propagation indexes. Wide tuning control unit 220 (FIG. 3) controls an amount of current conducted through the resistive heating element so as to set the center wavelength to a selected wavelength value. In one example, applying 300 mW of heat to one channel is sufficient to vary the center wavelength of the wide tuning profile through the full range from 1525 nm to 1565 nm.

The ring resonator portion 218 of the tuning chip includes a main channel 253 and a Y-section 254 splitting the main channel into separate inner channels 256 and 258 that run parallel to one another along opposing sides of a channel ring 260. An inner end of main channel 253 of the ring resonator is coupled to outer end 250 of main channel 244 of the Mach-Zehnder interferometer. Parallel channels 256 and 258 are sufficiently close to adjacent tangential portions of channel ring 260 to permit evanescent coupling between the ring channel and the parallel channels. With this configuration, light entering main channel 253 from the Mach-Zehnder interferometer is split into equal portions propagating outward along parallel channels 256 and 258. The portion propagating along channel 256 triggers clockwise propagation of light within ring channel 260, but only within narrow ranges of predetermined wavelengths. The light propagating clockwise in the ring, in turn, triggers inward propagation of light along channel 258 also within the narrow ranges of predetermined wavelengths. Likewise, the portion propagating outward along channel 258 triggers counter-clockwise propagation of light within ring channel 260 within narrow ranges of predetermined wavelengths which, in turn, triggers inward propagation of light along channel 256 also at the predetermined frequencies. The inward propagating signals are combined by Y-section 254 into a single optical beam along main channel 253 for output back into the Mach-Zehnder interferometer. In this manner, light is reflected by the ring resonator back into the Mach-Zehnder interferometer, but only within narrow ranges of predetermined wavelengths. Hence, resonance within the laser cavity can only arise within the narrow ranges of predetermined frequencies permitted by the ring resonator and is further limited by the wide tuning profile of the Mach-Zehnder interferometer, thus achieving the single sharp resonance peak illustrated in FIG. 6. Note that outer ends 262 and 264 of parallel channels 256 and 258 are coupled out of the tuning chip. Hence, any light at frequencies other than the predetermined frequencies is merely discharged from the tuning chip.

The predetermined frequencies depend upon the diameter of the ring channel. The tuning chip is fabricated to have a nominal ring channel diameter of about 300 $\mu$m so as to reflect light at sharp peaks having a free spectral range of about 1.5 nm (defined as the wavelength differences between adjacent spikes of FIG. 5). A heating element 266 is provided in the tuning chip to heat the chip so as to vary the diameter of the ring to adjust the wavelengths of the peaks through the free spectral range of 1.5 nm to thereby permit one of the peaks to be centered on any of the ITU C band channel wavelengths. The heating element may be a resistive element formed on top of the wave guide structure directly above of ring channel 260. Heating causes changes in the diameter and the mode index of the ring. In one example, application of 30 mW of heat produces an effect sufficient to vary the sharp peaks through the free spectral range of 1.5 nms.

In the implementation of FIG. 7, wherein the Mach-Zehnder interferometer and the ring resonator are adjusted by heating portions of the tuning chip, the wide tuning and fine tuning control units (FIG. 3) may be configured as circuits configured to vary the amount of current applied to the resistive heating elements so as to increase or decrease heating based on the wavelength feedback provided. The maximum tuning range for the device can be obtained through appropriate thermal adjustment of the three tuning sections (gain section, Mach-Zehnder section, and ring resonator section). Simultaneous tuning in this manner requires appropriate calibration of the thermal response of the tuning sections and characterization of their interactions.

DWDM with Mach-Zehnder/Reflective Fabry-Perot Etalon WTLs

Figure 9:
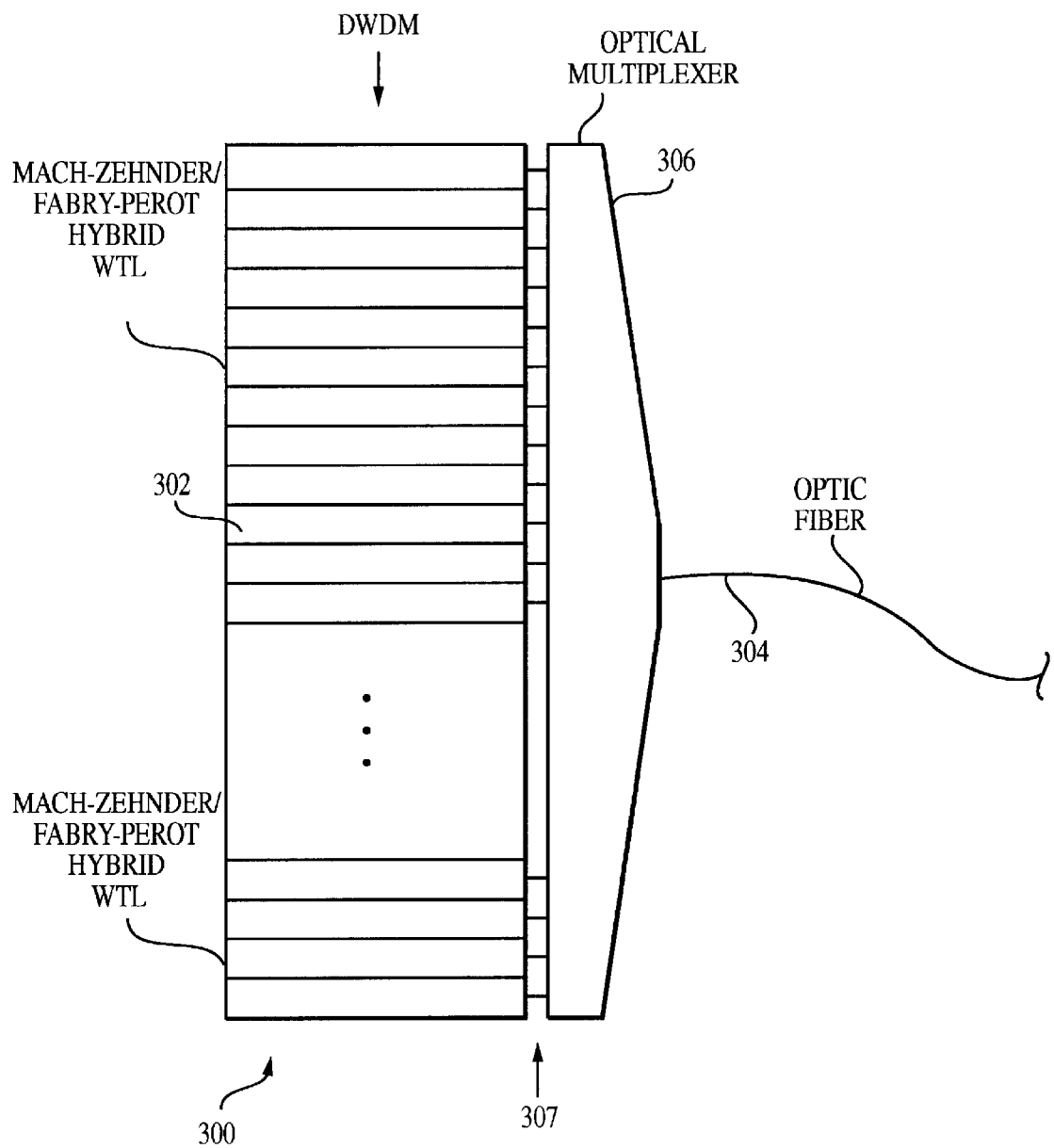
FIG. 9 illustrates a DWDM having hybrid WTLs configured in accordance with a second exemplary embodiment of the invention wherein each hybrid WTL has a laser cavity incorporating a Mach-Zehnder interferometer and a reflective Fabry-Perot etalon mirror.
Figure 10:
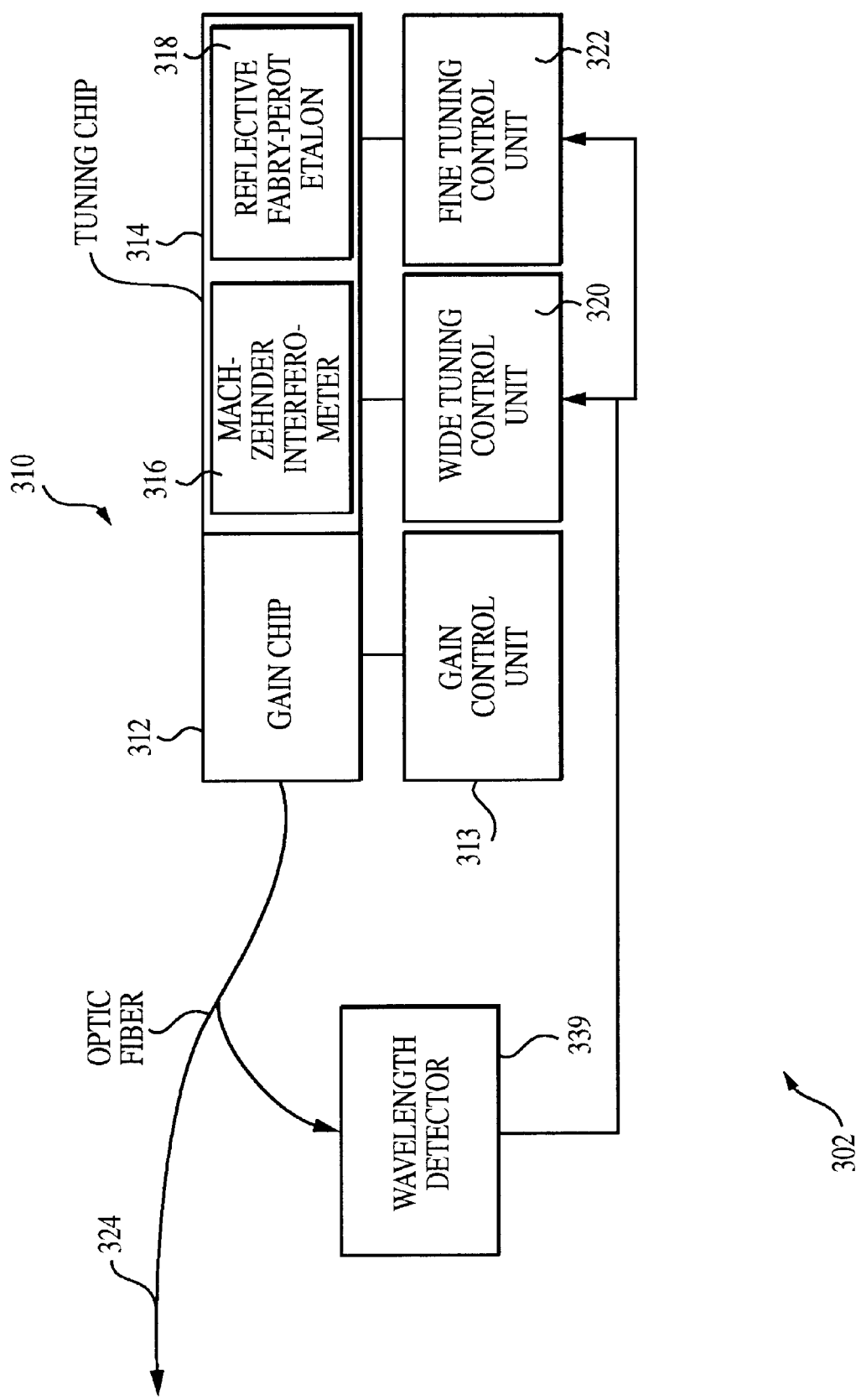
FIG. 10 is a block diagram illustrating an exemplary hybrid WTL for use in FIG. 9.
Figure 11:
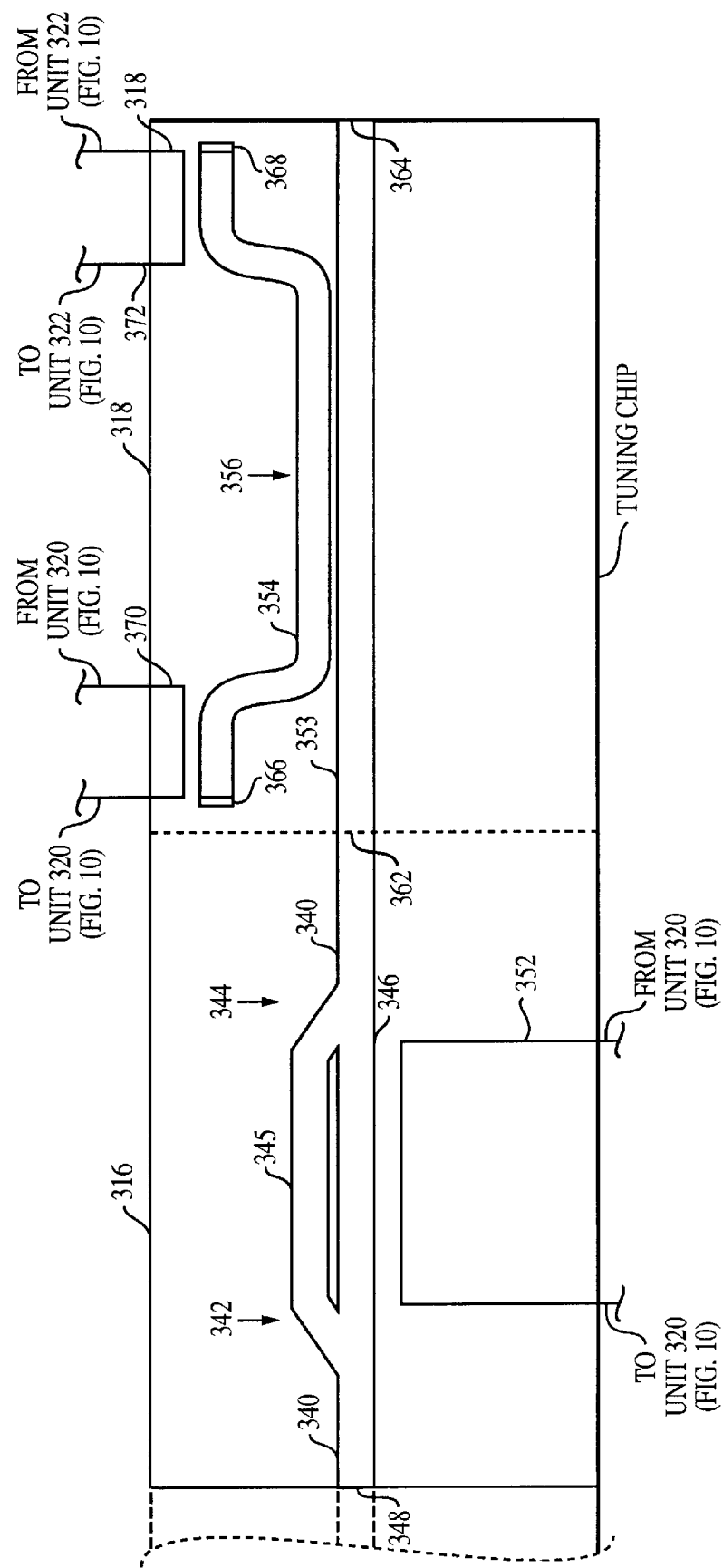
FIG. 11 is a top view of a tuning chip of the hybrid WTL of FIG. 10 illustrating optical channels of the tuning chip, and particularly illustrating the channels of the reflective Fabry-Perot etalon.

FIGS. 9–11 illustrate an exemplary embodiment of a DWDM similar to that of FIGS. 2–8 but using a reflective Fabry-Perot etalon as the wavelength-selective mirror rather than a ring resonator. Only pertinent differences will be described in detail. Other features will only be summarized. Referring first to FIG. 9, DWDM 300 incorporates a set of Mach-Zehnder/Fabry-Perot Etalon WTLs 302 for transmitting optical signals through intermediate optic fibers 307 into a multiplexer 306 then into a single output optic fiber 304. As with the DWDM described above, each individual WTL is tuned to transmit optical signals at a selected ITU C band channel.

FIG. 10 illustrates an exemplary one of the WTLs, which includes a laser cavity 310 formed from a gain chip 312 and a tuning chip 314 wherein the tuning chip includes a Mach-Zehnder interferometer 316 and a reflective Fabry-Perot etalon 318. The Mach-Zehnder interferometer operates under control of a wide tuning control unit 320 to limit resonance within the laser cavity to within a single broad peak centered near a selected ITU channel (FIG. 4). The reflective Fabry-Perot etalon operates as a fine tuning device under control of a fine tuning unit 322 to limit resonance within the laser cavity to within a set of sharp peaks (FIG. 5) and to align one of those sharp peaks with the selected ITU channel. To maintain proper alignment of the transmission wavelength of the WTL with the selected ITU channel a feedback system is provided, which includes a splitter connected to optical fiber 324 for splitting off a portion of the output optical signal to a wavelength detector 339, which provides feedback to control units 320 and 322. The combination of the Mach-Zehnder interferometer and the reflective Fabry-Perot etalon ensures that resonance within the laser cavity occurs substantially only at the selected ITU channel transmission wavelength (FIG. 6) and that the amplitudes of the adjacent sideband resonance wavelengths (also FIG. 6) are significantly lower than the amplitude of the transmission wavelength (and preferably at least 30 db lower). As with the DWDM described above, the actual amplitude of the sidebands depends not only on the shape of the wide tuning profile but on the combined characteristics of the gain chip and tuning cavity. The wide tuning profile need not necessarily account for the full 30 dB difference. For any particular application, routine experimentation is performed to determine optimal fabrication and operational characteristics for the WTL.

Referring now to FIG. 11, the configuration of optical waveguide channels within the tuning chip is shown. The Mach-Zehnder interferometer portion 316 of the tuning chip is configured as described above with a main channel 340 coupled to a first end 348 to an optical channel of the gain chip (shown in phantom lines), a pair of splitters 342 and 344, and separate inner channels 345 and 346 of differing length. A heating element 352 heats the chip under control of wide tuning control unit 320 (FIG. 10) so as to vary channel length and refractive index differences between inner channels 345 and 346 so as to center the wide tuning profile on a selected ITU channel wavelength.

The reflective etalon portion 318 of the tuning chip includes a main trunk channel 353 and a Fabry-Perot waveguide side channel 354 that run parallel to one another, with a central portion 356 of the side channel sufficiently close to a central portion of the main trunk channel 353 to permit evanescent coupling. An inner end 362 of main trunk channel 353 is aligned with an outer end of main channel 340 of the Mach-Zehnder interferometer. An outer end 364 of main trunk channel 353 is open (or is otherwise coupled out of the tuning chip). In contrast, side channel 354 is completely enclosed with reflective material at opposing ends forming mirrors 366 and 368. Preferably the mirrors consist of reflective material formed perpendicular to the direction of light propagation at the ends of the side channel to ensure that light is reflected directly back along the side channel.

With this configuration, light entering main channel 353 from the Mach-Zehnder interferometer triggers propagation of light within side channel 354 via evanescent coupling. Light propagating within the side channel reflects back and forth between mirrors 366 and 368 which, in turn, triggers propagation of light within main trunk channel 353 also via evanescent coupling. In general, light propagating from mirror 366 to mirror 368 triggers propagation of light within the main trunk channel toward open end 364. Light propagating from mirror 368 to mirror 366 triggers propagation of light within the main trunk channel toward the Mach-Zehnder interferometer. Depending upon wavelength, light propagating within the main trunk channel as a result of evanescent coupling from the side channel constructively or destructively interferes with light already propagating in the main trunk channel. At certain discrete Fabry-Perot resonance wavelengths, which depend on the length of the side channel, the constructive and destructive interference ensures that substantially all light entering main trunk channel 353 from the Mach-Zehnder interferometer is "reflected" back toward the Mach-Zehnder interferometer. At all other wavelengths, the constructive and destructive interference ensures that substantially all light entering the main trunk channel from the Mach-Zehnder interferometer passes out of the tuning chip via opening 364.

Hence, reflective etalon portion 318 acts as a wavelength-selective mirror that reflects light substantially only at the discrete Fabry-Perot resonance wavelengths. As a result, substantially only light at the discrete Fabry-Perot resonance wavelengths can resonate within the overall laser cavity producing the peaks shown in FIG. 5. The reflective Fabry-Perot etalon 318 is also referred to as a resonant optical reflector. Further information regarding resonant optical reflectors can be found in R. F. Kazarinov, C. H. Henry, and A. Olsson, "NarrowBand Resonant Optical Reflectors and Resonant Optical Transformers for Laser Stabilization and Wavelength Division Multiplexing", *Jour. of Quantum Electronics*, QE-23, NO9 (Sep. 1987), pp. 1419–1425, which is incorporated herein by reference.

The wavelength separation between the discrete Fabry-Perot resonance wavelength peaks (the free spectral range) depends upon the length of the Fabry-Perot side channel, i.e. the total light propagation distance from mirror to mirror. For a 50 Ghz separation between resonance peaks, and assuming a propagation constant of approximately 1.5, the length of the side channel is set to about 2 mm. The propagation constant is a characteristic of the waveguide channel, which depends, for example, on the shape of the waveguide and on the material used to form the waveguide, and is determined by conventional techniques. Note that, in the example of FIG. 11, the opposing ends of the side channel are offset from the main trunk channel by a greater distance than central portion 356. This is merely to simplify design of the device. Whereas the free spectral range is determined by the overall length of the Fabry-Perot side channel, the degree of evanescent coupling is determined primarily by the length of the coupling section and the channel separation of the coupling section. Hence, by offsetting the ends of the side channel from the main trunk by an amount sufficient to prevent evanescent coupling from occurring near the ends, the overall length of the side channel can be designed independently from the length of the coupling section. In one example, the central portion of the side channel is offset from the main trunk by a distance of 2–3microns, which is sufficiently close to permit evanescent coupling, whereas the mirrored ends are offset from the main trunk by 50 microns, which is sufficient distant to eliminate any significant evanescent coupling. As shown in FIG. 11, the Fabry-Perot side channel has S-shaped curves formed of semi-circular sections for connecting the central coupling section with the mirrored end sections. S-shaped curves are employed to minimize loss that might otherwise occur with sharply angled bends. Other curved shapes can be used as well, but using S-shaped curves formed of circular sections simplifies the overall design. The dimensions of FIG. 11 are not to scale.

Heating elements 370 and 372 are provided in the tuning chip to heat portions of the chip so as to vary the overall length of the Fabry-Perot side channel to adjust the wavelengths of the peaks through the free spectral range of 50 GHz to thereby permit one of the peaks to be aligned with any selected ITU C band channel wavelength. In the example of FIG. 11, the heating elements are formed adjacent the mirrored end portions of the side channel to permit the overall length of the side channel to be varied without significantly affecting the length of the central coupling section. In other words, the heating elements are positioned so that the length of the opposing end sections can be expanded or contracted based on the amount of heat applied; whereas the length of central coupling portion 356 will not vary significantly. Hence, application of heat only varies the free spectral range and does not significantly affect the coupling characteristics. Adjustment of the free spectral range of the Fabry-Perot etalon causes the wavelengths of individual Fabry-Perot peaks to vary. The wavelengths are adjusted until one is aligned with the selected transmission ITU channel wavelength.

The wide tuning profile of the Mach-Zehnder interferometer (FIG. 4) is also tuned to the selected ITU channel wavelength so as to permit full resonance at the selected wavelength while limiting the amplitude of adjacent sidebands (FIG. 6). The maximum tuning range for the device can be obtained through appropriate thermal adjustment of the three tuning sections (gain section, Mach-Zehnder section, and Fabry-Perot etalon section). More specifically, the three tuning sections are adjusted by first separately determining individual thermal response characteristics of the gain chip, the Mach-Zehnder interferometer and the reflective etalon. Then, thermal response interactions are determined among the three tuning sections. The separate amounts of thermal energy to be applied to the three tuning sections are then calculated to achieve the maximum tuning range based on the individual thermal response characteristics and on the thermal response interactions. Finally, the separate amounts of thermal energy are separately applied to the three tuning sections to thereby achieve the maximum tuning range. Simultaneous tuning in this manner requires appropriate calibration of the thermal response of the various tuning sections and characterization of their interactions, which can be achieved through routine experimentation.

What have been described are exemplary embodiments of a hybrid WTL for use within a DWDM for generating ITU C band channels. Principles of the invention, however, may be applied to other lasers or optical devices for use in other applications. Accordingly, the invention is not intended to be limited to the embodiments shown herein but is to be accorded the widest scope consistent with the principles and novel features disclosed herein. The exemplary embodiments have been primarily described with reference to block diagrams illustrating pertinent components of the embodiments. It should be appreciated that not all components of a complete implementation of a practical system are necessarily illustrated or described in detail. Rather, only those components necessary for a thorough understanding of the invention have been illustrated and described in detail. Actual implementations may contain more components or, depending upon the implementation, fewer components.

What is claimed is:

1. A semiconductor laser having a cavity comprised of:
   a gain chip for providing radiant energy within the cavity;
   an interferometric wide tuning port for generating resonances within the cavity and having at least two interferometric optical channels, with at least one of the interferometric optical channels having an adjustable length, to selectively generate resonances at selectable wavelengths; wherein the interferometric wide tuning port has a coarse tuning profile to generate a broad peak for limiting resonances within the cavity to a single broad peak;
   a wavelength selective mirror for generating resonances within the cavity and receiving radiant energy with a single broad peak from the interferometric wide tuning port, having a main channel and an adjustable side channel, such that the main channel and the side channel have portions formed sufficiently close to one another to selectively permit evanescent coupling of radiant energy propagating at frequencies dependent upon the length of the side channel; wherein the wavelength-selective mirror has a fine tuning profile to generate a set of sharp peaks which further limit resonances within the cavity; and
   wherein the interferometric wide tuning port aligns a wavelength of the broad peak at a selected wavelength, and the wavelength selective mirror aligns one of the sharp peaks also at the selected wavelength, to provide sufficient resonance for the laser to emit a sharp peak at the tuned wavelength.

2. The semiconductor laser of claim 1 wherein the interferometer wide tuning port is a Mach-Zehnder interferometer.

3. The semiconductor laser of claim 2 wherein the Mach-Zehnder interferometer comprises:
   an input optical channel;
   a splitter for splitting the input optical channel into the at least two interferometric optical channels having differing lengths; and
   a combining section for combining the at least two optical channels into a single output channel.

4. The semiconductor laser of claim 3 further including a wide tuning control unit operative to adjust an optical path length difference between the pair of optical channels of the Mach-Zehnder interferometer to maintain alignment of a broad output peak of the Mach-Zehnder interferometer with a selected wavelength.

5. The semiconductor laser of claim 4 further comprising a heating element configured to thermally adjust the optical path length difference.

6. The semiconductor laser of claim 2 wherein the Mach-Zehnder interferometer is formed on a separate planar wave guide chip.

7. The semiconductor laser of claim 1 further including a fine tuning control unit operative to adjust a length of the side channel so as to maintain alignment of a sharp output peak of the wavelength selective mirror at a selected wavelength.

8. The semiconductor laser of claim 7 further comprising a heating element configured to thermally adjust the length of the side channel so as to maintain alignment of a sharp output peak of the wavelength selective mirror at a selected wavelength.

9. The semiconductor laser of claim 7 further comprising a wavelength detector coupled to the fine tuning control unit configured to detect the wavelength of a signal output by the laser.

10. The semiconductor laser of claim 1 wherein a central portion of the side channel is formed sufficiently close to the main channel to permit evanescent coupling of radiant energy along the central portion and wherein the opposing ends of the side channel are formed sufficiently far from the main channel to prevent evanescent coupling of radiant energy at the opposing ends.

11. The semiconductor laser of claim 1 wherein the gain chip is formed on a III/IV material chip.

12. The semiconductor laser of claim 1 wherein the wavelength selective mirror is formed using planar wave guides.

13. The semiconductor laser of claim 1 further comprising a gain chip control unit configured to control the output of the gain chip.

14. The semiconductor laser of claim 1 wherein an intensity emitted by the laser at the selected wavelength is 30 dB greater than sideband wavelengths emitted by the laser.

15. The semiconductor laser of claim 4 further comprising a wavelength detector coupled to the wide tuning control unit configured to detect the wavelength of a signal output by the laser.

16. The semiconductor laser of claim 1 wherein the gain chip is an InGaAsP gain chip.

17. The semiconductor laser of claim 1 wherein the wavelength selective mirror is a reflective Fabry-Perot etalon.

18. The semiconductor laser of claim 1 wherein the wavelength selective mirror is a resonant optical reflector.

19. The semiconductor laser of claim 1 wherein a central portion of the side channel is offset from the main trunk by a distance of approximately 2 to 3 microns.

20. The semiconductor laser of claim 1 wherein the length of the side channel is approximately 1.5 microns.

21. The semiconductor laser of claim 1 wherein the interferometric wide tuning port and the wavelength selective mirror are provided on a silicon tuning chip.

22. The semiconductor laser of claim 21 wherein the silicon tuning chip comprises a unitary structure of silicon.

23. The semiconductor laser of claim 1 further comprising:

first heating means for heating the interferometric wide tuning port; and second heating means for heating the wavelength selective mirror.

24. A semiconductor laser having a cavity comprised of:

means for providing radiant energy and gain for resonance within the cavity;

wide tuning means for limiting resonance within the cavity based on a wide tuning profile having a broad peak having at least two interferometric optical channels with at least one of the interferometric optical channels having an adjustable length to selectively interfere resonances generated by the gain chip; and fine tuning means for further limiting resonance within the cavity to within a set of sharp resonance peaks having a main channel and a side channel having a length that is adjustable with reflecting surfaces formed at opposing ends, with the main channel and the side channel having portions formed sufficiently close to one another to selectively permit evanescent coupling of radiant energy propagating therein at frequencies dependent upon the length of the side channel; and wherein the wide tuning means aligns a wavelength of the broad peak at a selected wavelength, and the fine tuning means aligns one of the sharp peaks also at the selected wavelength, to provide sufficient resonance for the laser to emit a sharp peak at the tuned wavelength.

25. The semiconductor laser of claim 24 wherein the means for providing radiant energy and gain is a gain chip.

26. The semiconductor laser of claim 24 wherein the tuning means includes a mach-zehnder interferometer.

27. The semiconductor laser of claim 26 wherein the wide tuning means also includes means for controlling the Mach-Zehnder interferometer to maintain alignment of the broad peak of the wide tuning profile with the selected wavelength.

28. The semiconductor laser of claim 24 wherein the fine tuning means is a reflective Fabry-Perot etalon.

29. The semiconductor laser of claim 28 wherein the fine tuning means including means for controlling the the reflective Fabry-Perot etalon to maintain alignment of one of the sharp peaks with the selected wavelength.

30. A method for operating a semiconductor laser having cavity formed from a gain chip, a Mach-Zehnder interferometer and a wavelength selective mirror, comprising the steps of:

controlling the gain chip to provide radiant energy for resonance within the cavity;

controlling the Mach-Zehnder interferometer to limit resonance within the cavity based on a wide tuning profile having a broad peak set to a selected wavelength, wherein the Mach-Zehnder interferometer includes a pair of optical channels of differing lengths and wherein the step of controlling the Mach-Zehnder interferometer is performed by adjusting an optical path length difference between the pair of optical channels; and controlling the wavelength selective mirror to further limit resonance within the cavity to within a set of sharp resonance peaks, with a wavelength of one of the sharp peaks also set to the selected wavelength, having a main channel and a side channel having a length that is adjustable with reflecting surfaces formed at opposing ends, with the main channel and the side channel having portions formed sufficiently close to one another to selectively permit evanescent coupling of radiant energy propagating therein at frequencies dependent upon the length of the side channel and wherein the step of controlling the wavelength selective mirror is performed by adjusting the length of the side channel.

31. The method of claim 30 further including the steps of outputting an optical beam from the semiconductor laser cavity;

detecting a wavelength of the output beam;

controlling the Mach-Zehnder interferometer to maintain alignment of the broad peak of the wide tuning profile with the selected wavelength; and controlling the wavelength selective mirror to maintain alignment of one of the sharp resonance peaks at the selected wavelength.

32. The method of claim 30 further including the step of adjusting the gain chip, the Mach-Zehnder interferometer and the a wavelength selective mirror to provide a maximum tuning range.

33. The method of claim 32 wherein the gain chip, the Mach-Zehnder interferometer and the wavelength selective mirror are each thermally-adjustable and wherein the step of adjusting the gain chip, mach-zehnder interferometer and the wavelength selective mirror to provide a maximum tuning range includes the steps of:

separately determining individual thermal response characteristics of the gain chip, the Mach-Zehnder interferometer and the wavelength selective mirror;

determining thermal response interactions among the gain chip, the Mach-Zehnder interferometer and the wavelength selective mirror;

determining separate amounts of thermal energy to apply to the gain chip, the Mach-Zehnder interferometer and the wavelength selective mirror to achieve the maximum tuning range based on the individual thermal response characteristics and on the thermal response interactions; and simultaneously applying the separate amounts of thermal energy to the gain chip, the Mach-Zehnder interferometer and the wavelength selective mirror to thereby achieve the maximum tuning range.

34. The method of claim 30, wherein the wavelength selective mirror is a reflective Fabry-Perot etalon.

35. A laser multiplexer system comprising:

a plurality of lasers each operative to generate a respective laser beam; and an optical multiplexer operative to combine the plurality of laser beams into an optic fiber for transmission; and wherein each laser has a cavity comprised of:

a gain chip for providing radiant energy within the cavity;

an interferometric wide tuning port for generating resonances within the cavity and having at least two interferometric optical channels, with at least one of the interferometric optical channels having an adjustable length, to selectively generate resonances at selectable wavelengths; wherein the interferometric wide tuning port has a coarse tuning profile to generate a broad peak for limiting resonances within the cavity to a single broad peak;

a wavelength selective mirror for generating resonances within the cavity and receiving radiant energy with a single broad peak from the interferometric wide tuning port, having a main channel and an adjustable side channel, such that the main channel and the side channel have portions formed sufficiently close to one another to selectively permit evanescent coupling of radiant energy propagating at frequencies dependent upon the length of the side channel; wherein the wavelength-selective mirror has a fine tuning profile to generate a set of sharp peaks which further limit resonances within the cavity; and wherein the interferometric wide tuning port aligns a wavelength of the broad peak at a selected wavelength, and the wavelength selective mirror aligns one of the sharp peaks also at the selected wavelength, to provide sufficient resonance for the laser to emit a sharp peak at the tuned wavelength.

* * * * *